US012592279B2

(12) United States Patent
Cho et al.

(10) Patent No.: US 12,592,279 B2
(45) Date of Patent: Mar. 31, 2026

(54) NEURAL NETWORK HARDWARE DEVICE AND SYSTEM

(71) Applicant: The Government of the United States of America, as represented by the Secretary of the Navy, Arlington, VA (US)

(72) Inventors: Hans Cho, Vienna, VA (US); Frank Keith Perkins, Alexandria, VA (US); Cory D. Cress, Springfield, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 421 days.

(21) Appl. No.: 18/329,213

(22) Filed: Jun. 5, 2023

(65) Prior Publication Data

US 2023/0422516 A1     Dec. 28, 2023

Related U.S. Application Data

(60) Provisional application No. 63/356,166, filed on Jun. 28, 2022.

(51) Int. Cl.
G11C 11/54 (2006.01)
G06N 3/049 (2023.01)
(Continued)

(52) U.S. Cl.
CPC .............. G11C 11/54 (2013.01); G06N 3/049 (2013.01); G06N 3/063 (2013.01); G06N 3/065 (2023.01);
(Continued)

(58) Field of Classification Search
CPC ......... H10N 79/00; H10N 70/00–8845; G11C 11/54; H10B 63/00; G06N 3/049; G06N 3/06; G06N 3/063–065
See application file for complete search history.

(56) References Cited

U.S. PATENT DOCUMENTS

2016/0019453 A1     1/2016   Klefenz et al.
2017/0058418 A1     3/2017   Gershon et al.
(Continued)

OTHER PUBLICATIONS

Ohmic Weave: Memristor-Based Threshold Gate Networks; Mountain et al.; Dec. 2015; DOI: 10.1109/MC.2015.369 (Year: 2015).*
(Continued)

*Primary Examiner* — Christine S. Kim
*Assistant Examiner* — Tyler J Wiegand
(74) *Attorney, Agent, or Firm* — US Naval Research Laboratory; Jorie L. Stroup

(57)          ABSTRACT
Neural network systems and methods are provided. In one embodiment, a method of making a neural network device includes: forming a mesh layer on a substrate, the mesh layer including a matrix of randomly dispersed conductive nano-strands insulated from one another; forming an isolation trench extending into the mesh layer; forming a memristor device extending into the mesh layer, the memristor device including: an electrical conductor, and a layer of memristive material in electrical contact with individual nano-strands of a first set of conductive nano-strands in the mesh layer; forming an electrode extending into the mesh layer and spaced from the memristor device by the isolation trench, wherein the electrode is in electrical contact with individual conductive nano-strands of a second set of conductive nano-strands in the mesh layer; and forming a modulating device bridging the memristor device and the electrode.

20 Claims, 11 Drawing Sheets

(51) Int. Cl.

| | |
|---|---|
| *G06N 3/063* | (2023.01) |
| *G06N 3/065* | (2023.01) |
| *H10B 63/00* | (2023.01) |
| *H10N 70/00* | (2023.01) |
| *H10N 70/20* | (2023.01) |
| *H10N 79/00* | (2026.01) |

(52) U.S. Cl.

CPC ........... *H10B 63/00* (2023.02); *H10N 70/828* (2023.02); *H10N 70/20* (2023.02); *H10N 79/00* (2023.02)

(56) References Cited

U.S. PATENT DOCUMENTS

| | | | |
|---|---|---|---|
| 2019/0019564 A1 * | 1/2019 | Li ........................... | G06N 3/049 |
| 2019/0393412 A1 * | 12/2019 | Vianello .............. | H10N 70/011 |
| 2021/0257411 A1 * | 8/2021 | Kendall .............. | H10N 70/826 |
| 2023/0015231 A1 * | 1/2023 | Kawaguchi ............ | H10D 8/053 |

OTHER PUBLICATIONS

Reliable Memristive Switching Memory Devices Enabled by Densely Packed Silver Nanocone Arrays as Electric-Field Concentrators; You et al.; Oct. 2016; ACS Nano 2016, 10, 10, 9478-9488 (Year: 2016).*

* cited by examiner

NEURAL NETWORK HARDWARE DEVICE AND SYSTEM

CROSS-REFERENCE TO RELATED APPLICATIONS

This application is a non-provisional of, and claims the benefit of priority under 35 U.S.C. § 119 based on, U.S. Provisional Patent Application No. 63/356,166 filed Jun. 28, 2022. The Provisional Application and all references cited herein are hereby incorporated by reference into the present disclosure in their entirety.

FEDERALLY SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case No. 211068-US1.

BACKGROUND OF THE INVENTION

Aspects of the present invention relate generally to neuromorphic computing, and more particularly, to neural network hardware devices and systems.

In general, neuromorphic computing is an approach to computing that is inspired by the structure and function of biological brain functions. For example, neuromorphic computer chips use physical artificial neurons (e.g., made from silicon) to perform computations. In some silicon neuromorphic chips, a time-multiplexing scheme known as an address-event representation (AER) protocol is used to digitally mediate neuro-synaptic interconnections. Such chips require a digital interface and data exchange with remote memory.

Software-based neuromorphic systems include spiking neural networks (SNNs), which are artificial neural networks that closely mimic natural neural networks by firing (outputting) at a moment of threshold crossing. In conventional artificial neural networks (ANN), the nodes and interconnections are virtual, mathematical entities in data, and can be manipulated by software.

SUMMARY OF THE INVENTION

In a first aspect of the invention, there is a method for manufacturing a neural network device including: forming a mesh layer on a substrate, the mesh layer including a matrix of randomly dispersed conductive nano-strands insulated from one another; forming an isolation trench extending into the mesh layer; forming a memristor device extending into the mesh layer, the memristor device including: an electrical conductor, and a layer of memristive material in electrical contact with individual nano-strands of a first set of conductive nano-strands in the mesh layer; forming an electrode extending into the mesh layer and spaced from the memristor device by the isolation trench, wherein the electrode is in electrical contact with individual conductive nano-strands of a second set of conductive nano-strands in the mesh layer; and forming a modulating device bridging the memristor device and the electrode.

In embodiments of the invention, the memristor device is configured to send electrical signals received from the individual nano-strands of the first set of conductive nano-strands to the modulating device via the electrical conductor, and the modulating device is configured to automatically send an output signal to the electrode when stored potential at the modulating device due to the electrical signals exceeds a predetermined threshold value.

In another aspect of the invention, there is a neural network device including: a mesh layer including a matrix of randomly dispersed conductive nano-strands within an insulating material; a memristor device extending through at least part of the mesh layer, the memristor device including: a layer of memristive material in contact with a set of conductive nano-strands in the mesh layer, and an electrical conductor; an electrode extending through at least part of the mesh layer and spaced from the memristor device; and a modulating device bridging the memristor device and the electrode.

In another aspect of the invention, there is a system including: a plurality of spaced-apart neural network devices sharing a mesh layer including a matrix of randomly dispersed conductive nano-strands in an insulating substrate, wherein each of the neural network devices includes: a memristor device extending through at least part of the mesh layer, the memristor device including: a layer of memristive material in contact with conductive nano-strands in the mesh layer, and an electrical conductor; an electrode extending through at least part of the mesh layer and spaced from the memristor device; a modulating device bridging the memristor device and the electrode; and an electrical input in communication with a set of conductive nano-strands in the mesh layer.

BRIEF DESCRIPTION OF THE DRAWINGS

Aspects of the present invention are described in the detailed description which follows, in reference to the noted plurality of drawings by way of non-limiting examples of exemplary embodiments of the present invention.

DETAILED DESCRIPTION

Figure 1:
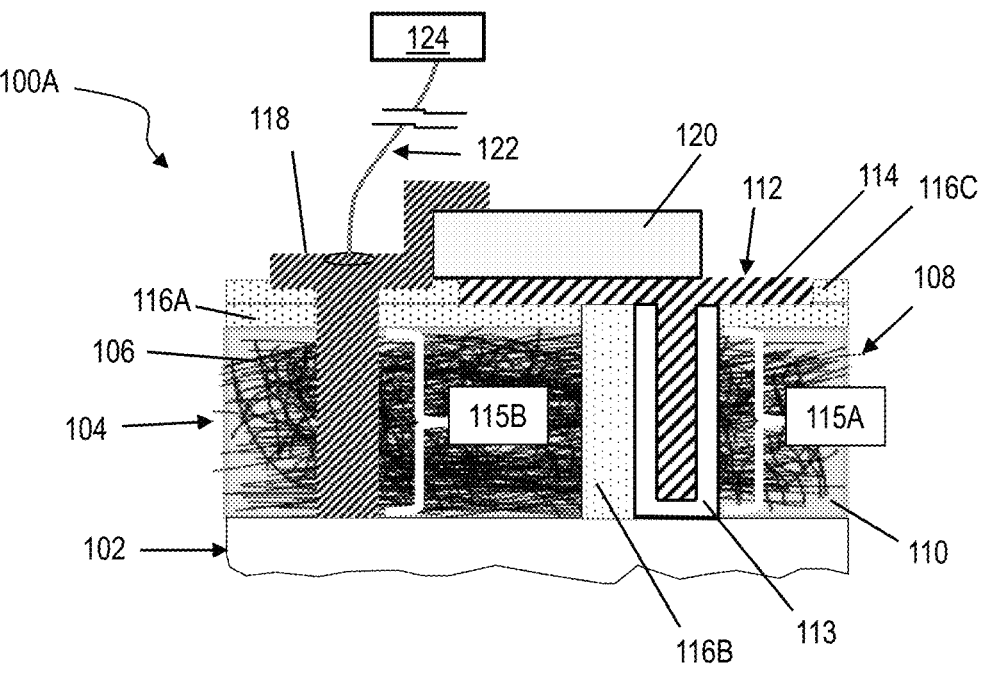
FIG. 1 depicts a first neural network device in accordance with embodiments of the present invention.

Aspects of the present invention relate generally to neuromorphic computing, and more particularly, to neural network hardware devices and systems. In embodiments, a neural network device comprises a dense mesh or matrix of randomly distributed lengths of conductive nano-strands in the form of insulated nanowires or carbon nanotube (CNT) conductors coated with an insulating material. A memristor device (conductive synaptic device) formed within the matrix includes a memristive material (e.g., metal oxide) in electrical contact with a first set of conductive nano-strands within the matrix at individual contact points or nodes. A modulating device forms an electrical bridge between the memristor device and a second set of conductive nano-strands within the matrix via an electrode extending through the matrix. The memristor device is configured to accumulate electrical inputs (e.g., current) from individual conductive nano-strands of the first set of conductive nano-strands and selectively output an electrical signal to the electrode. In implementations, when a stored potential accumulated from the individual conductive nano-strand inputs reaches a pre-determined threshold at the modulating device, the modulating device is configured to "spike" or output an electrical signal through the electrode to individual conductive nano-strands in the second set of conductive nano-strands. In this way, the neural network device can generally mimic the propagation of signals at spiking neurons in biological systems.

Various neuromorphic engineering approaches have been explored in an attempt to mimic biological neural networks. Conventional artificial neural networks (ANNs) provide few restrictions on the number and nature of interconnections within a computer network, but are realized in a digital van Neumann hardware architecture (e.g., a digital computer including a processing unit, control unit, memory, external mass storage and input and output mechanisms), with increasingly burdensome size, weight and power requirements in relation to number of interconnections.

Nanoimprint lithography (NIL) is a method of fabricating nanometer scale patterns in a substrate, and is often utilized to fabricate devices for electrical applications. In man-made physical neural networks such as neuromorphic circuits, dendritic interconnect numbers commensurate with biological systems (1000s to 10000s in mammals) are not physically (topologically) attainable by conventional planar lithographic patterning and metallization. In order to achieve more than nearest-neighbor connections on a substrate, multiple additional lithographic steps would be required. For example, the number of lithography layers (and corresponding process steps) needed increases with the number of interconnections desired. Interconnects with a coordination number of thousands and spanning a network of billions of nodes could require several hundred or more lithography steps and the accompanying deposition and etching steps. Furthermore, lithographically defined networks are pre-defined (deterministic), and therefore lack the randomness in connectivity desired in a neural network model.

Some silicon neuromorphic chips utilize a time-multiplexing scheme known as an address-event representation (AER) protocol to digitally mediate neuro-synaptic interconnections. However, AER protocols or architecture require a digital interface and data exchange with remote memory, and thus retain the inefficiencies of the digital van Neumann computing architecture.

Crossbar structures or crossbar switches, are a collection of switches arranged in a matrix configuration, including multiple input and output lines that form a crossed pattern of interconnecting lines between which a connection may be stablished. Crossbar structures, while enabling many-to-many connections, suffer from crosstalk between adjacent lines. Additionally, crossbar structures are limited to a defined (deterministic) pattern of matrix-like connections, with limited ability to connect to arbitrarily complex configurations and especially to non-adjacent contact nodes.

In biological systems, dendrites are branched extensions of a nerve cell that propagate electrochemical stimulation received from other neural cells to a cell body of the nerve cell (neuron) from which the dendrites project. Electrical stimulation is transmitted onto dendrites by upstream neurons via synapses (i.e., junctions between two nerve cells across which impulses pass). The term dendritic spike refers to an action potential generated in the dendrite of a neuron. In general, an influx of sodium ions causes an increase in voltage at a dendritic membrane, and if the voltage increases past a certain threshold, voltage-gated sodium channels are activated to transmit a current along the dendrite. Crossbar, ANN, and AER architectures/methods fail to replicate the variety of spike arrival timing information that arises from the length and impedance differentials of biological dendrites.

Advantageously, embodiments of the invention provide a physical neural network device enabling electrical communication between a large number of individual conductive nano-strands (e.g., >100-10,000) of different lengths in a first set, and a large number of individual conductive nano-strands (e.g., >100-10,000) of different lengths in a second set, without interference between the conductive nano-strands, and in a manner that is non-deterministic (i.e., can exhibit different behaviors on different runs, even for the same input). Implementations of the invention provide a physical (hardware) neural network structure enabling dendritic or branched electrical communication between individual conductive nano-strand nodes. Embodiments of the invention enable a much large number of interconnects between individual conductive nano-strand nodes (e.g., >1,000) beyond what is possible with conventional lithographic methods, for example. Implementations of the invention provide a spiking neural network structure with enhanced capability, complexity and reliability over other types of physical electrical devices. Neuromorphic devices and systems of the present invention may be useful in a number of applications where non-deterministic signal propagation is desired.

FIG. 1 depicts a first neural network device 100A in accordance with embodiments of the present invention. The first neural network device 100A comprises a base substrate 102, and a mesh layer 104 formed thereon comprised of a matrix 106 of randomly dispersed individual conductive nano-strands 108 isolated from one another within an insulating material 110 (e.g., a dielectric material). In embodiments, the conductive nano-strands 108 are in the form of insulated nanowires or carbon nanotube (CNT) strands. In implementations of the invention, the conductive nano-strands 108 comprise multiwalled CNT strands, or bundles of CNT strands, clad in an insulating polymer. In other implementations, the conductive nano-strands 108 comprise nanowires with a conductive core and an outer insulating shell layer (e.g., a core-shell (CS) nanowire (NW)). In embodiments, the conductive nano-strands 108 have a length from 100 micrometers (μm) to >1 millimeter (mm). In implementations, the conductive nano-strands 108 are randomly dispersed on the base substrate 102 to form a dense mat, with a majority of the conductive nano-strands 108 (>50%) extending roughly in the same longitudinal direction (e.g., ±30°). Such a configuration may be referred to as a massively parallel nanowire or CNT mesh.

A memristor device 112 extends through the mesh layer 104, and includes a memristor layer 113 in electrical contact with a first set of the conductive nano-strands represented at 115A, and an electrical conductor 114. The term memristor as used herein refers to an electrical component that remembers an amount of charge that has previously flowed through it, and can be utilized to limit or regulate the flow of electrical current in a circuit. In implementations, the memristor device 112 can be trained to have different resistance at different contact nodes at the memristor layer 113. Implementations of the invention enable large-scale connectivity between contact nodes.

In the embodiment of FIG. 1, one or more layers of insulating material shown at 116A-116C separate the memristor device 112 from a second set of the conductive nano-strands represented at 115B, which are in electrical contact with an electrode 118 extending through the mesh layer 104. A modulating device 120 is in electrical contact with the memristor device 112 and the electrode 118 and forms a bridge there between. The term modulating device as used here refers to a device that receives multiple electrical signal inputs, and which outputs a signal based on the multiple electrical signal inputs.

In implementations, the modulating device 120 is a spiking neuron device or node enabling selective propagation of electrical signals within the neural network device 100A. In embodiments, the modulating device 120 is configured to selectively enable electrical communication between the memristor device 112 and the electrode 118, thereby selectively enabling electrical communication between the first set of conductive nano-strands 115A and the second set of conductive nano-strands 115B. Optionally, the first neural network device 100A can include a wire 122 connecting the electrode 118 to a remote device or electrical source indicated at 124. While shown connected to the electrode 118 in FIG. 1, it should be understood that the wire 122 may alternatively be connected to the modulating device 120, or an additional wire (not shown) may connect the modulating device 120 to another remote device or electrical source (not shown).

Figure 2:
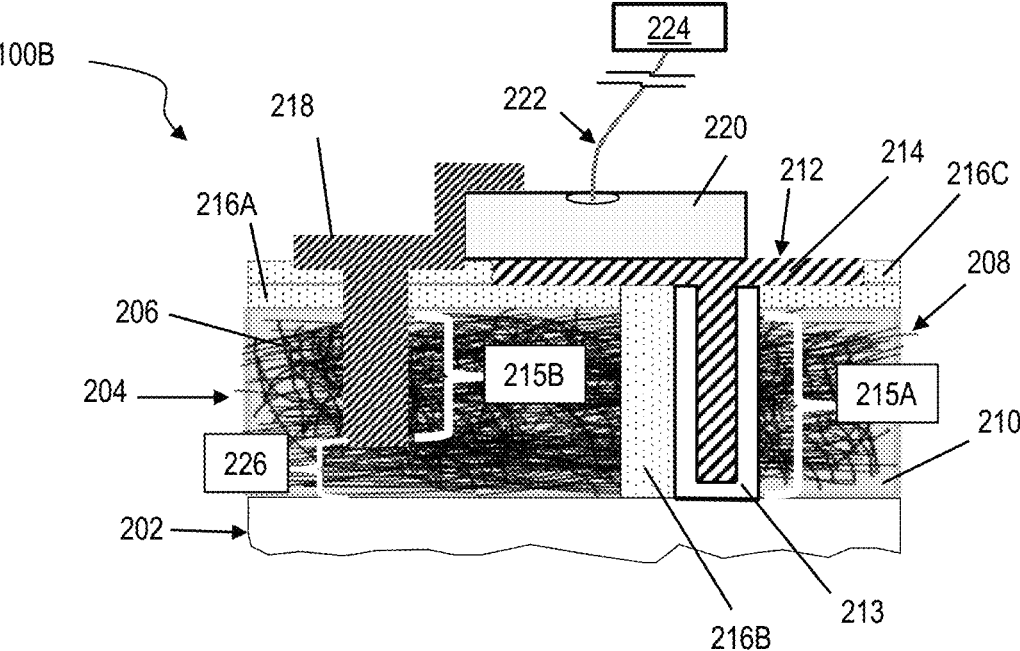
FIG. 2 depicts a second neural network device in accordance with embodiments of the present invention.

FIG. 2 depicts a second neural network device 100B in accordance with embodiments of the present invention. The second neural network device 100B includes elements corresponding to those of the first neural network device 100A in FIG. 1. Specifically, the second neural network device 100B includes a base substrate 202, and a mesh layer 204 formed thereon comprised of a matrix 206 of randomly dispersed individual conductive nano-strands 208 within an insulating material 210. A memristor device 212 includes a memristor layer 213 in electrical contact with a first set of the conductive nano-strands represented at 215A, and an electrical conductor 214. One or more layers of insulating material shown at 216A-216C separate the memristor device 212 from a second set of the conductive nano-strands 215B in electrical contact with an electrode 218. In contrast to the electrode 118 of FIG. 1, the electrode 218 extends only partially into the matrix 206, leaving a portion of the matrix 226 between the electrode 218 and the base substrate 202.

As with the first neural network device 100A, a modulating device 220 is in electrical contact with the memristor device 212 and the electrode 218 and forms a bridge there between. In embodiments, the modulating device 220 is configured to selectively enable electrical communication between the memristor device 212 and the electrode 218. Optionally, a wire 222 connects the modulating device 220 to a remote device or electrical source indicated at 224. While shown connected to the modulating device 220, it should be understood that the wire 222 may alternatively be connected to the electrode 218, or an additional wire (not shown) may connect the electrode 218 to another remote device or electrical source (not shown).

Figure 3:
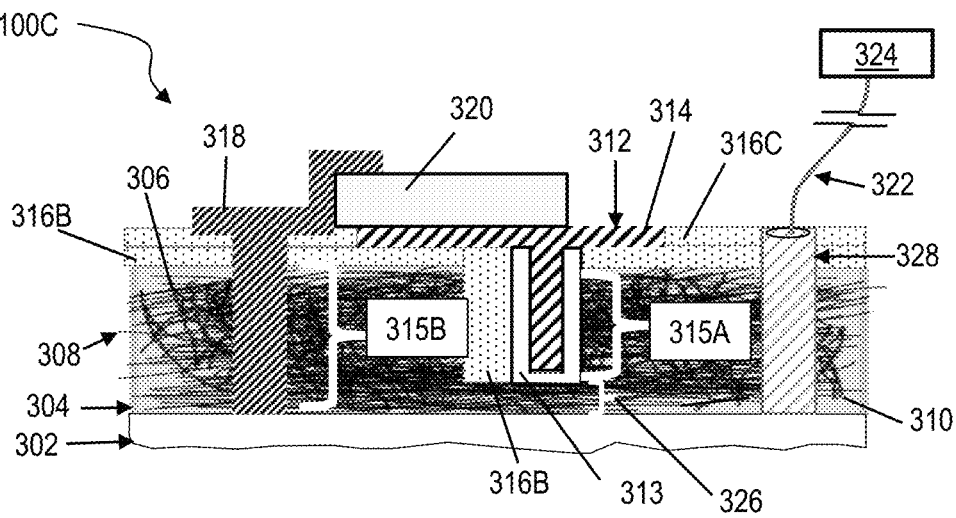
FIG. 3 depicts a third neural network device in accordance with embodiments of the present invention.

FIG. 3 depicts a third neural network device 100C in accordance with embodiments of the present invention. The third neural network device 100C includes elements corresponding to those in FIG. 1. Specifically, the third neural network device 100C includes a base substrate 302, and a mesh layer 304 formed thereon comprised of a matrix 306 of randomly dispersed individual conductive nano-strands 308 within an insulating material 310. A memristor device 312 includes a memristor layer 313 in electrical contact with a first set of the conductive nano-strands represented at 315A, and an electrical conductor 314. One or more layers of insulating material shown at 316A-316C separate the memristor device 312 from a second set of the conductive nano-strands 315B in electrical contact with an electrode 318. In contrast to the memristor device 112 and insulating material 116B of FIG. 1, the memristor device 312 and insulating material 316B extend only partially into the matrix 306, leaving a portion of the matrix 326 between the memristor device 312 and insulating material 316B, and the base substrate 302.

Optionally, the third neural network device 100C includes a via 328 (e.g., a nano-via) extending through the matrix 304 and configured to supply electrical signals from an electrical input source 324 to a plurality of conductive nano-strands of the matrix 304 that are in electrical contact therewith. Although not depicted, the via 328 may optionally be incorporated into the first and/or second neural network devices 100A and 100B. As with the first neural network device 100B, a modulating device 320 is in electrical contact with the memristor device 312 and the electrode 318, and forms a bridge there between. In embodiments, the modulating device 320 is configured to selectively enable electrical communication between the memristor device 312 and the electrode 318.

In implementations, the via 328 acts as an electrical input to supply electrical current to a first set of conductive nano-strands in electrical contact with the via, which then transmit electrical signals to the memristor device 312 at an interface with the memristor layer 113. In implementations, individual electrical signals from each conductive nano-strand in the set of conductive nano-strands are carried by the memristor device 312 to the modulating device 320 by the electrical conductor 314, and accumulate at the modulating device 320. In embodiments, the modulating device 320 is configured to "spike" and send an electrical output to the electrode 318 once the accumulated electrical signals have reached a predetermined threshold value. The electrical output is then transmitted from the electrode 318 to individual nano-strands in electrical contact with the electrode 318 (i.e., the second set of conductive nano-strands). Optionally, additional wires (not shown) may connect the electrode 318 and/or the modulating device 220 to one or more remote devices (not shown). In implementations, the first, second and third neural network devices 100A-100C may be single devices, or may be individual devices within a network or array of neural network devices.

Figure 4:
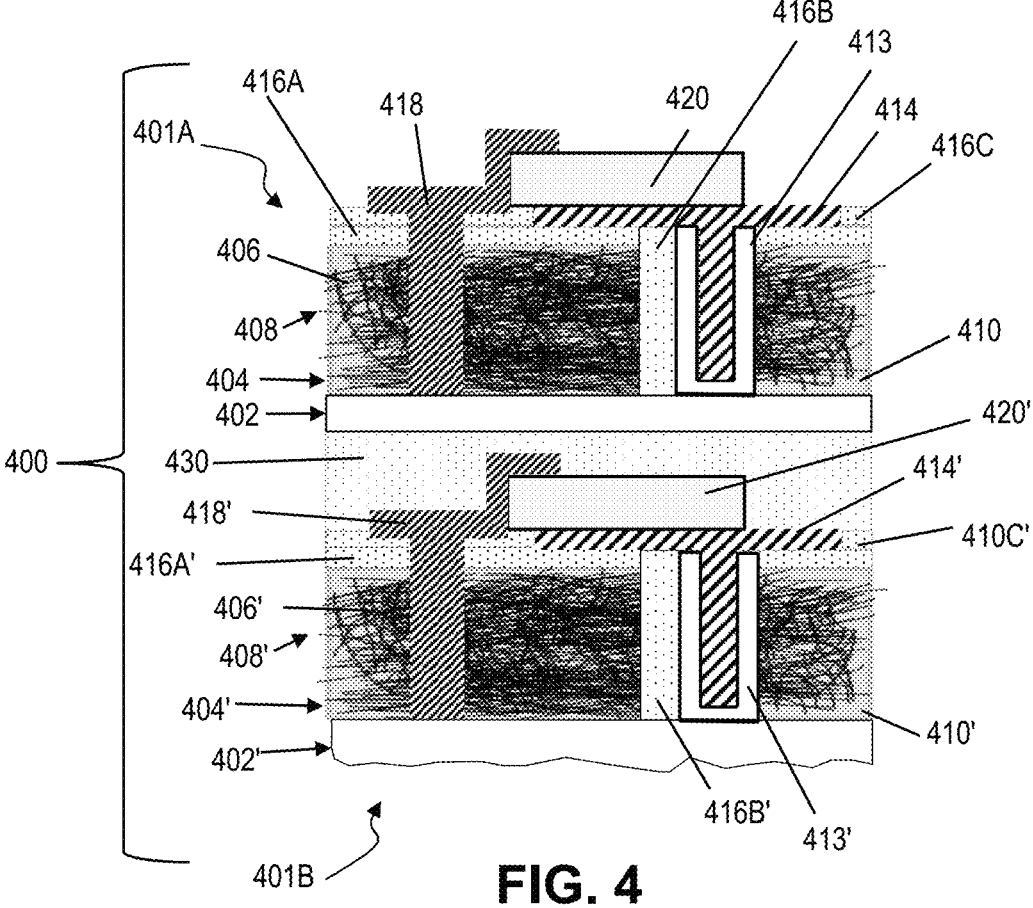
FIG. 4 depicts a stacked neural network device in accordance with embodiments of the present invention.

FIG. 4 depicts a stacked neural network device 400 in accordance with embodiments of the present invention. The exemplary stacked neural network device 400 of FIG. 4 includes a first neural network device 401A above a second neural network device 401B. The first and second neural network devices 401A and 401B each include elements corresponding to like elements of the first neural network device 100A in FIG. 1. Specifically, 400 and 400' series reference numbers correspond to 100 series reference numbers in FIG. 1 (e.g., 402 and 402' correspond to 102, etc.). The stackable nature of devices according to embodiments of the invention enables the deposition of multiple layers of conductive nano-fiber meshes in three-dimensions to increase the density of electrical communication nodes, without limit. Although not depicted, wires may be positioned between portions of the first and second neural network devices 401A and 401B to transmit electrical signals between layers of neural network devices, as desired.

Figure 5:
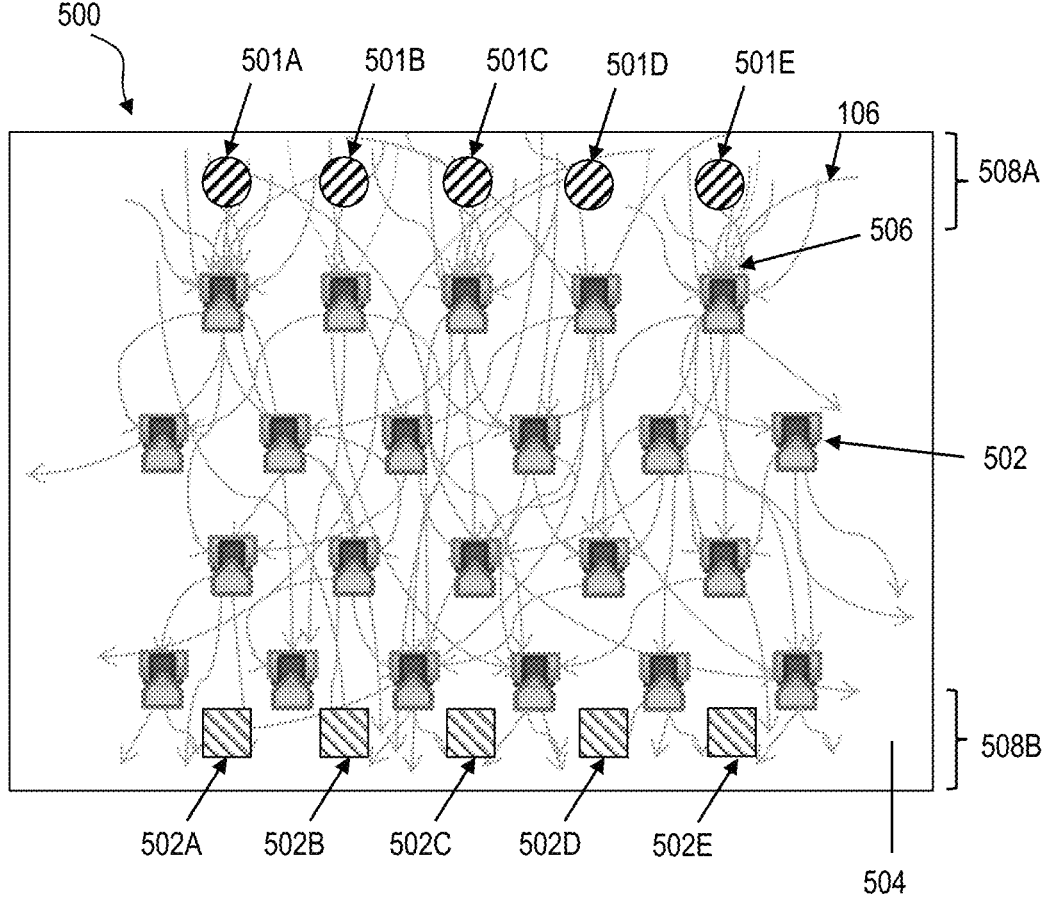
FIG. 5 depicts a system including an array of interconnected neural network devices in accordance with embodiments of the present invention.

FIG. 5 depicts a system 500 including an array of interconnected neural network devices, one of which is labeled at 502, in accordance with embodiments of the present invention. It should be understood that various embodiments discussed herein (e.g., 100A, 100B, 100C) may be utilized in the system 500 of FIG. 5, either alone or in combination. In implementations, a plurality of neural network devices 502 are formed on a substrate 504 including a mesh layer of conductive nano-strands 506 formed thereon. Thus, it can be understood that each neural network device 502 in the system 500 shares the same mesh layer 506. In embodiments, a set of spaced electrical contacts (e.g., vias) 501A-501E are formed in the mesh layer of conductive nano-strands 506. In the example of FIG. 5, the set of spaced electrical contacts 501A-501E are formed along a first side portion 508A of the system 500, and another set of spaced electrical contacts (e.g., vias) 502A-502E are formed along an opposing side portion 508B of the system 500. However, various configurations of electrical contacts and neural network devices 502 may be utilized in accordance with embodiments of the invention, and the invention is not intended to be limited to only the configuration of electrical contacts depicted. In embodiments, the system 500 is augmented with electrically conductive (e.g., metallic) global interconnects (e.g., metal filled trenches interconnecting elements of FIG. 5) formed using conventional lithography techniques, if needed to assemble larger networks from local clusters of neural network devices 502. In implementations, global interconnects are used to connect multiple arrays or systems (e.g., 500).

Figure 6A:
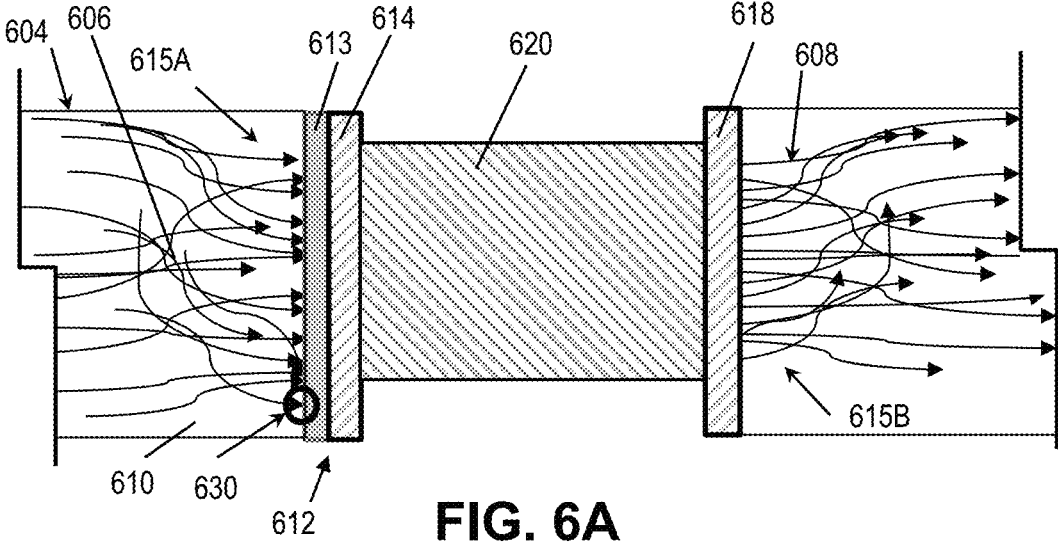
FIG. 6A depicts a partial cross-sectional view of a modulating device bridging first and second sets of conductive nano-strands in accordance with embodiments of the present invention.

FIG. 6A depicts a partial cross-sectional view of a modulating device 620 bridging first and second sets of conductive nano-strands 615A and 615B in accordance with embodiments of the present invention. In implementations, a neural network device includes a mesh layer 604 comprised of a matrix 606 of randomly dispersed individual conductive nano-strands 608 within an insulating material 610. A memristor device 612 extends through the mesh layer 604, and includes a memristor layer 613 in electrical contact with a first set of the conductive nano-strands represented at 615A, and an electrical conductor 614. A second set of the conductive nano-strands represented at 615B are in electrical contact with an electrode 618 extending through the mesh layer 604. The modulating device 620 is in electrical contact with the electrical conductor 614 of the memristor device 612 and the electrode 618, and forms a bridge there between. In embodiments, the memristor layer 613 comprises a layer of integrated nodes comprising a thin film of metal oxide such as hafnium oxide (HfO$_2$) as a non-volatile memristor junction bridging the first set of conductive nano-strands 615A and the electrical conductor 614 (e.g., a metal film electrode).

In implementations, each point of electrical contact of a conductive nano-strand 608 with the memristor layer 613 is a node or synapse (e.g., node 630) having a particular electrical resistance. Because memristor materials take on a particular character (e.g., resistance) based on electrical signals that have previously encountered the materials, in implementations, modulating devices of the present invention are "trained" by causing a known/desired electrical signal to impinge on the memristor materials to create a particular resistance effect at the point of contact. In one example, a known electrical signal (current) is run through a first conductive nano-strand contacting the memristor layer 613, such that the electrical signal impinges on the memristor layer 613 at a first contact point (node). Due to the "memory" of the memristor layer 613, the memristor layer will take on a particular resistance value for all subsequently applied electrical signals at the first contact point. Another known electrical signal may be run through a second conductive nano-strand such that the electrical signal impinges on the memristor layer 613 at a second contact point (node), causing the second contact point to take on another resistance value for all subsequently applied electrical signals.

In implementations, the neural network device 600 mimics biological neural functions. More specifically, conductive nano-strands 608 act as input dendrites, each node (e.g., 630) acts as a neuron node, and the resistance at each node 630 acts as a synaptic weight. In implementations, each node 630 functions as a leaky integrate and fire (LIF) neuron that accumulates charge from its dendritic current inputs modulated by their respective synaptic weights, such that the modulating device 620 acts as a spiking neuron and spikes when the stored potential at the modulating device 620 exceeds a predetermined threshold, thereby transmitting an electrical signal.

Figure 6B:
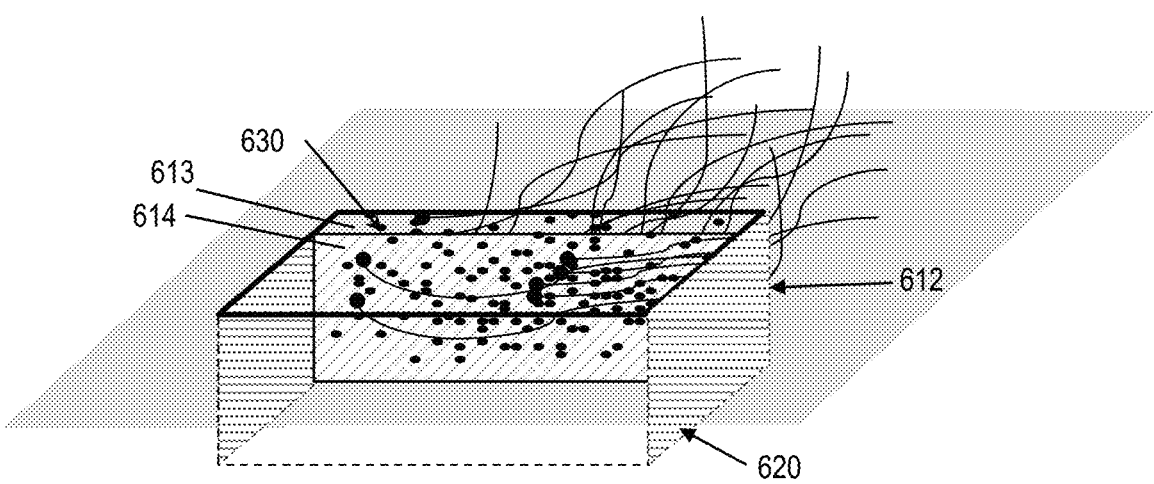
FIG. 6B depicts a partial cross-sectional perspective view of conductive nano-strand nodes at a memristor device interface in accordance with embodiments of the present invention.

FIG. 6B depicts a partial cross-sectional perspective view of conductive nano-strand nodes 630 at the memristor device 612 interface in accordance with embodiments of the present invention. More specifically, nodes (e.g., 630) represent a point of electrical contact of a conductive nano-strand 608 with the memristor layer 613. In embodiments, each node has a specific resistance, and transmits an electrical signal to the modulating device 620 (depicted in FIG. 6A) via the electrical conductor 614 of the memristor device 612.

Figure 7A:
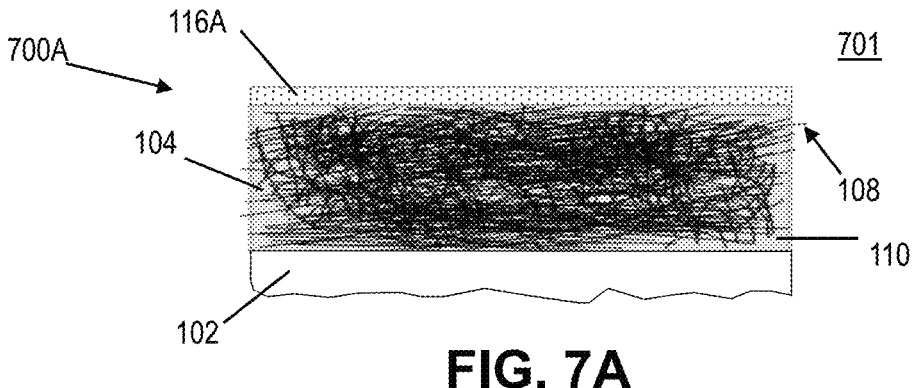
FIGS. 7A-7O illustrate manufacturing steps of a neural network device in accordance with embodiments of the present invention.
Figure 7B:
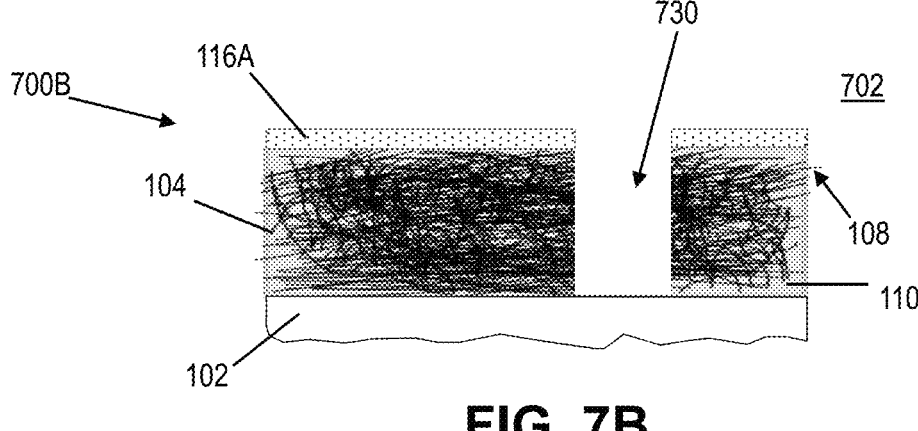
Figure 7C:
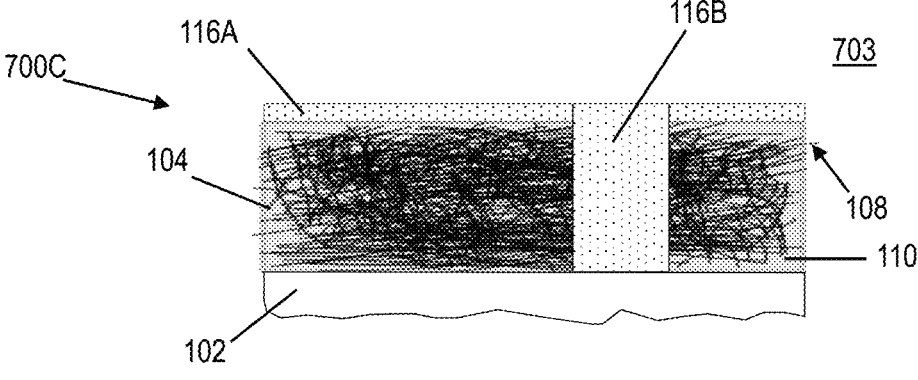
Figure 7D:
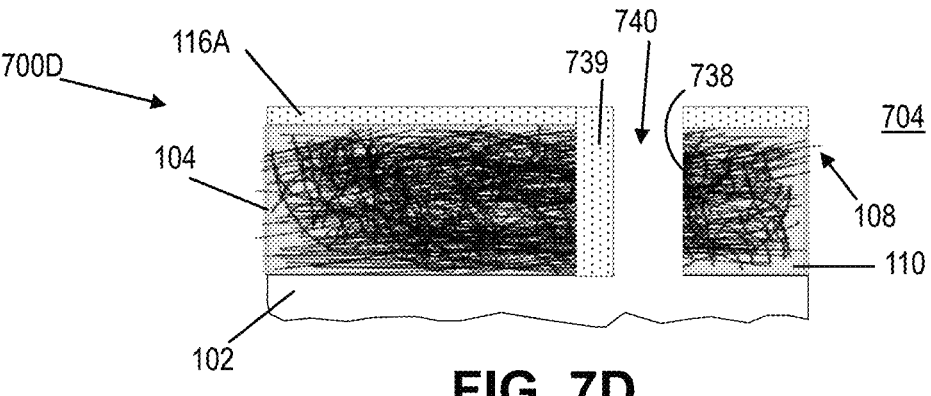
Figure 7E:
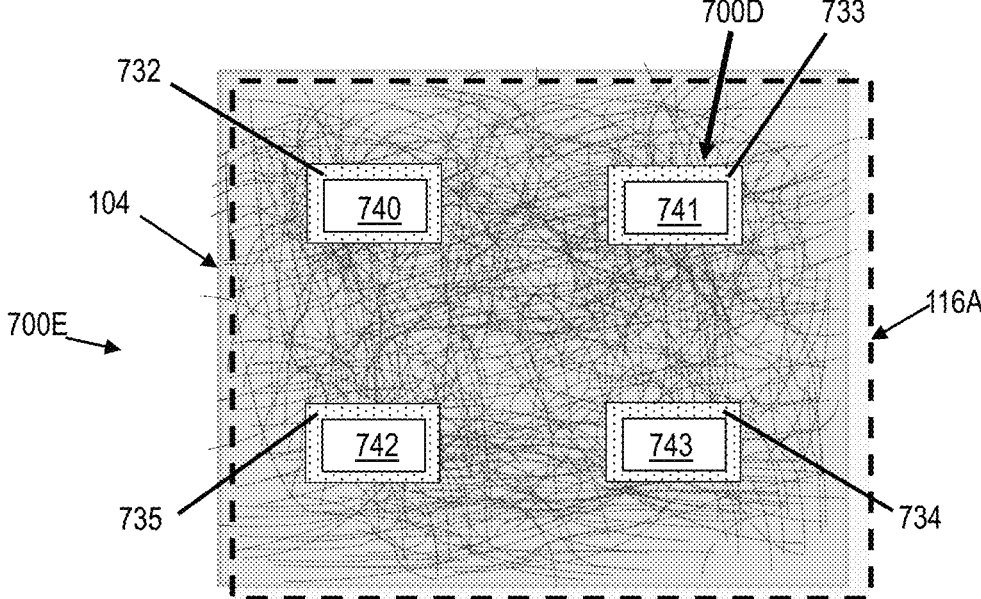
Figure 7F:
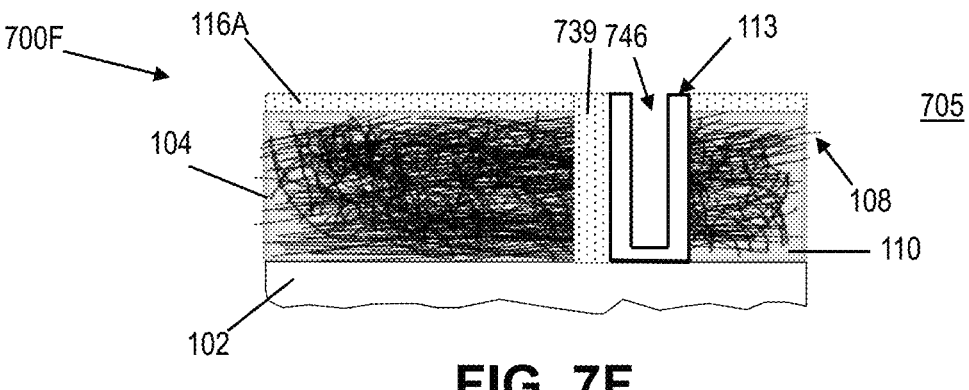
Figure 7G:
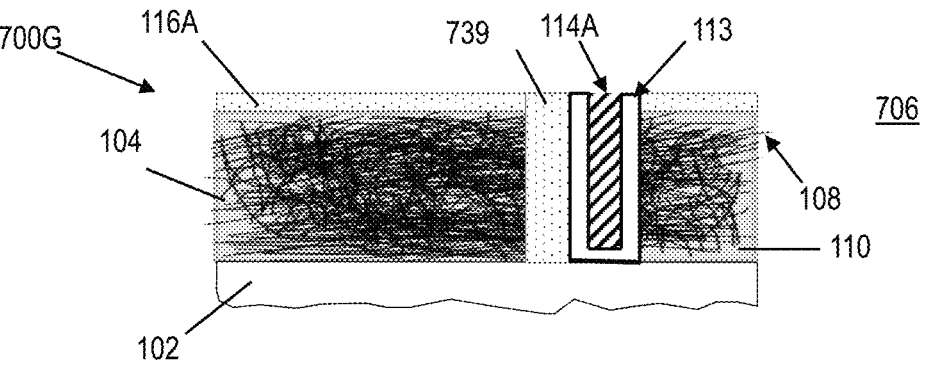
Figure 7H:
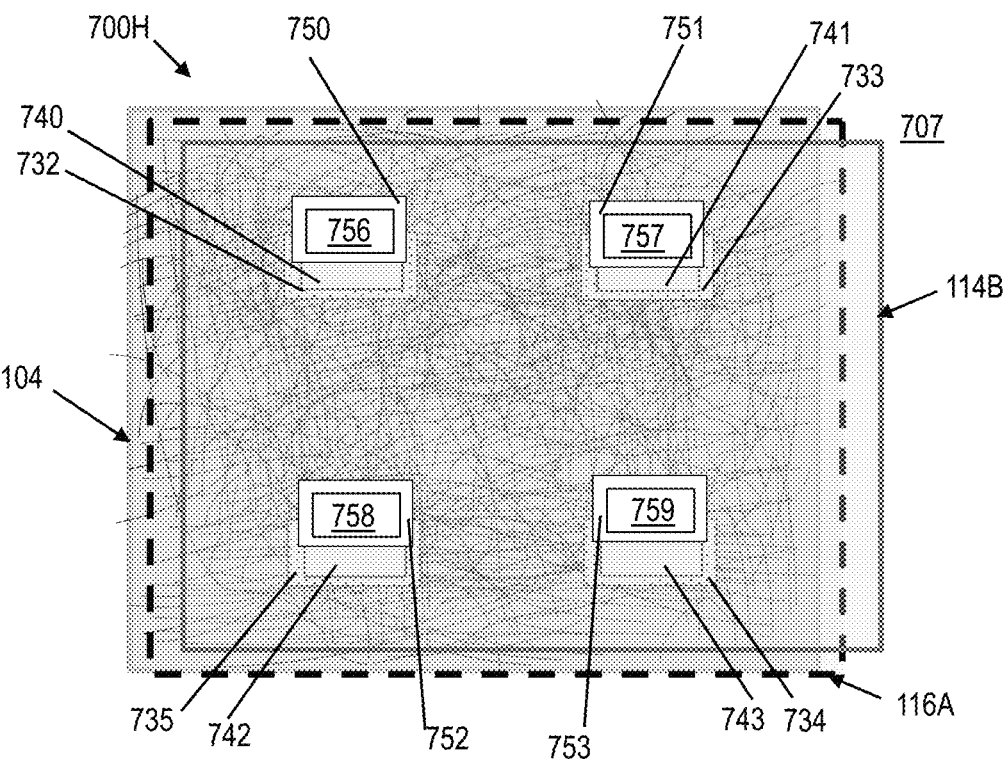
Figure 7I:
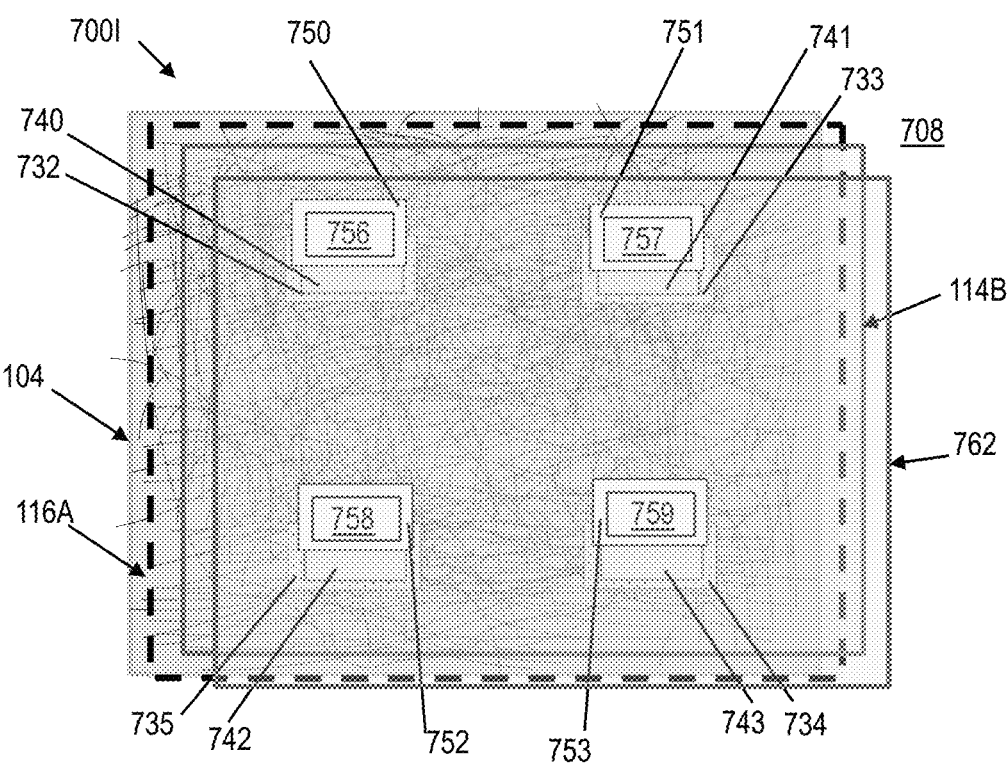
Figure 7J:
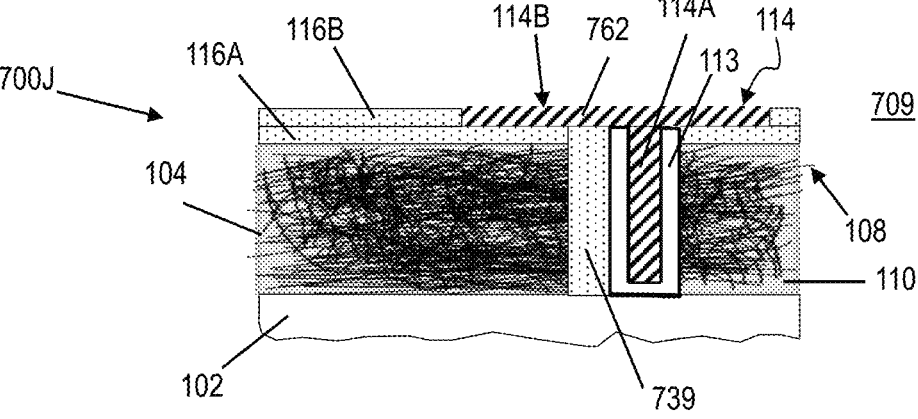
Figure 7K:
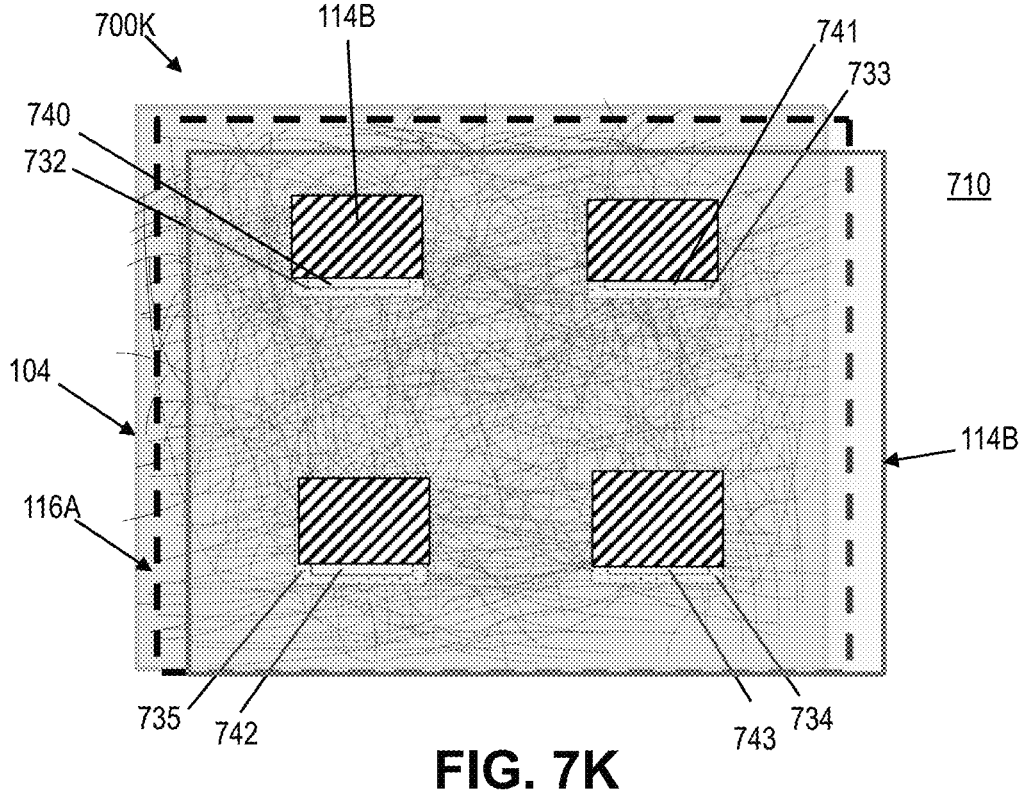
Figure 7L:
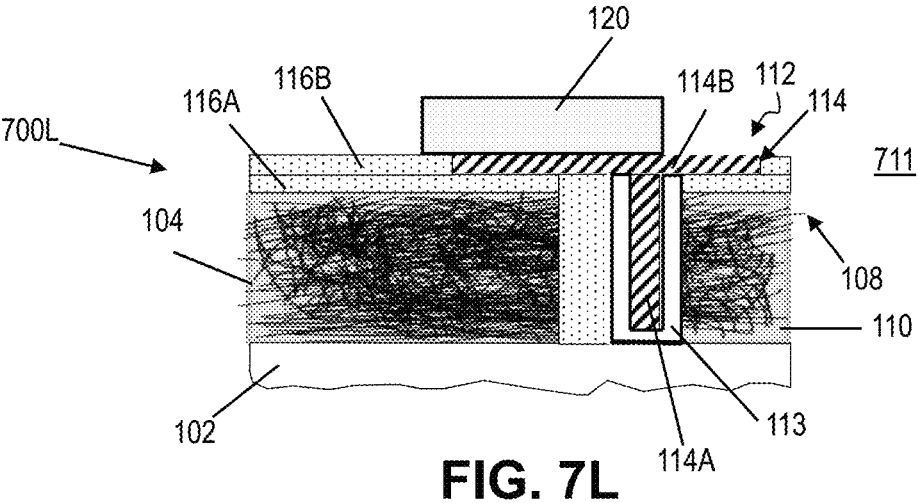
Figure 7M:
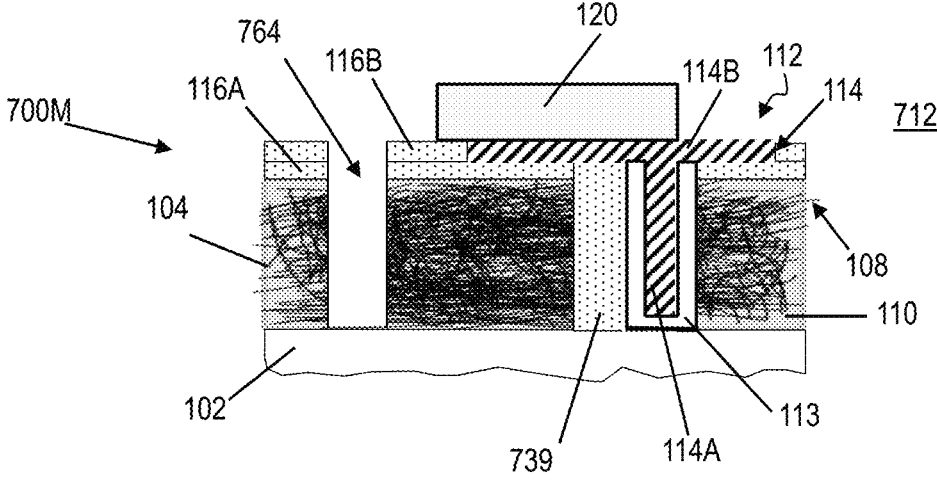
Figure 7N:
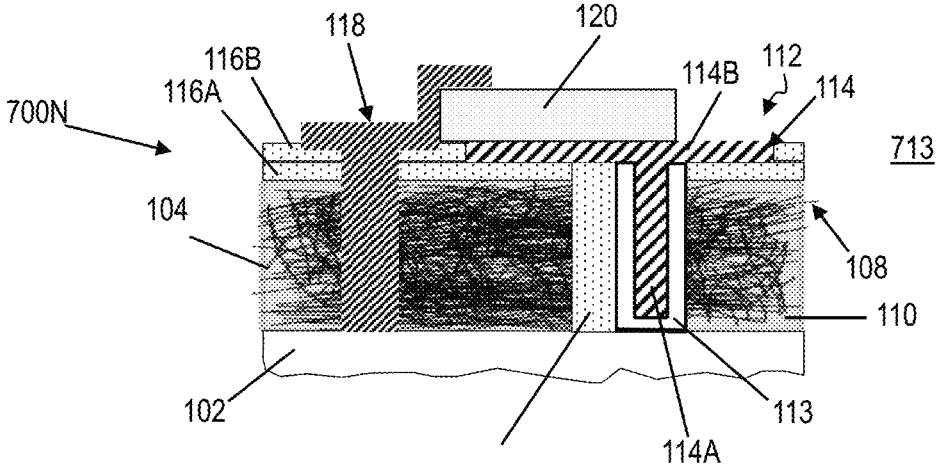
Figure 7O:
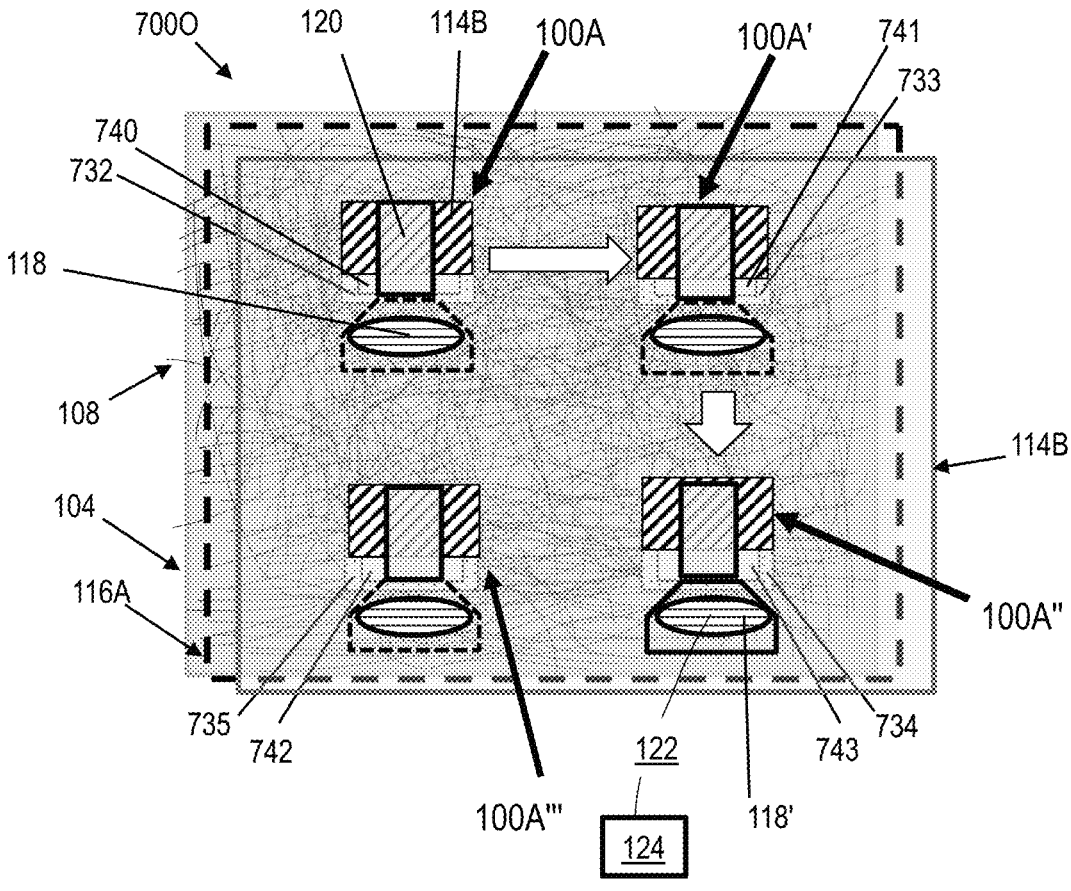

FIGS. 7A-7O illustrate manufacturing steps of the neural network device 100A in accordance with embodiments of the present invention. More specifically, FIGS. 7A-7D, 7F-7G, 7J, 7L, and 7M-7N show cross-sectional views of the neural network device 100A during a manufacturing process in accordance with embodiments of the invention. FIGS. 7E, 7H, 7I, 7K and 7O depict a top view of a neural network system (including multiple neural network devices 100A) during manufacturing in accordance with embodiments of the invention.

With initial reference to FIG. 7A, at process 701, a mesh layer 104 of conductive nano-strands 108 in an insulating material 110 (e.g., dielectric) is formed on a substrate 102 of a device under construction (DUC) 700A. In embodiments, mesh layer 104 is formed with a spin-coating process including dispersing the conductive nano-strands 108 in a solution, spin-coating the substrate 102 with the conductive nano-strand solution, and evaporating the solution over the course of one or more cycles to form a dense mat of conductive nano-strands 108 over the entire substrate 102. The conductive nano-strands 108 may be in the form of core-shell nanowires (e.g., core-insulating shell nanowires) or carbon nanotube (CN) fibers (e.g., metallic multi-walled CNs, metallic single-wall CNs, and/or bundles of CNs). In implementations, conductive nano-strands 108 are long enough to connect any two neural network devices (e.g., 100A, 100B, 100C) formed in an array (e.g., 500) of neural network devices, as discussed in more detail below. In aspects of the invention, the conductive nano-strands 108 are long enough to connect a first neural network device (e.g., 100A) to a second neural network device (e.g., 100B) in an array (e.g., 500), wherein the second neural network device is farther from the first neural network device than a nearest-neighbor or next nearest-neighbor. In order to achieve such lengths, the conductive nano-strands 108 may comprise multiple connected nano-fibers. In one example, an array is formed such that, what was originally a single conductive nano-fiber 108 in the mesh layer 104, now extends between, and is in electrical communication with, a first neural network device and a third neural network device, and is also in electrical communication with an intermediate second neural network device between the first and third neural network devices. Thus, an array can be formed such that an original single conductive nano-strand 108 may interact with multiple neural network devices in the array. In embodiments, the conductive nano-strands 108 are between hundreds of microns to millimeters in length, and from several nanometers to tens of nanometers in diameter.

In embodiments, insulation between conductive nano-strands is achieved by polymeric or other dielectric coatings. In implementations, each conductive nano-strand 108 is insulated along its length, and the conductive nano-strands 108 densely overlap in three (3) dimensions without forming electrical leakage paths between individual conductive nano-strands 108. In implementations, the insulating material 110 is applied to the conductive nano-strands 108 during the spin-coating process or after the spin-coating process to form the mesh layer 104. In embodiments, an insulating material (e.g., dielectric layer) is applied over the top of the mesh layer 104 to form a first insulating layer 116A. In implementations, the first insulating layer 116 comprises one or more dielectric ceramics (oxide or nitride) deposited by chemical vapor deposition or spin coating.

Turning to FIG. 7B, at process 702, a trench 730 is formed through the first insulating layer 116A and at least part way through the mesh layer 104 of the DUC 700A, thereby forming the DUC 700B. Established lithographic techniques (e.g., etching) can be utilized to form the trench 730. In implementations, forming the trench 703 cuts through the conductive nano-strands 108 in the mesh layer 104, and exposes electrically conductive portions of the conductive nano-strands 108 at the walls of the trench 730.

With reference to FIG. 7C, at process 703, the trench 730 of the DUC 700B is filled with an insulating material to form at least one second insulating layer or channel 116B, resulting in a DUC 700C. The insulating material may be the same or different from the insulating material of the first insulating layer 116A. In embodiments, the insulating material covers exposed electrically conductive portions of the conductive nano-strands 108 within the trench 730.

Turning to FIG. 7D, at process 704, a memristor trench 740 (a synaptic input contact trench) is formed through the first insulating layer 116A, and at least part way through the mesh layer 104 and a portion of the second insulating layer 116B of the DUC 700C, thereby defining an isolation trench 739 and forming DUC 700D. In implementations, forming the memristor trench 740 leaves ends of conductive nano-strands exposed and partially intact at sidewalls 738 of the memristor trench 740, such that electrically conductive portions of the conductive nano-strands 108 within the mesh layer 104 are exposed to the memristor trench 706. In aspects of the invention, the isolation trench 739 acts to isolate electrical signal output of conductive nano-strands from connecting to electrical signal inputs of conductive nano-strands of the same neural network device.

FIG. 7E illustrates a neural network system under construction (hereafter system) 700E, including DUCs 700D, after the completion of the process 704 of FIG. 7D. The system 700E represents an embodiment wherein a system being built includes four of the neural network devices 100A. In the example of FIG. 7E, four isolation trenches 739 (represented at 732-735) and four memristor trenches 740-743 have been formed. Layers 104 and 116A are shown slightly offset for illustrative purposes only.

Turning to FIG. 7F, at process 705, one or more layers of memristive material 113 (e.g., synaptic memristor oxide) are conformally deposited on the sides and bottom of the memristor trench 740 (depicted in FIG. 7D) in a manner that defines a contact trench 746, resulting in a DUC 700F. The term memristive material refers to materials that exhibit the properties of memristance, in that electricity flowing through the memristive material varies according to the history of electric charge that has flowed through the memristive material previously. The layer of memristive material 113 has a thickness that defines the size of the contact trench 746. In embodiments, the electrically conductive portions of conductive nano-strands 108, exposed by forming the memristor trench at process 704, are integrated into the memristive material 113. In implementations, the layer of memristive material 113 comprises a thin film of metal oxide such as hafnium oxide ($HfO_2$).

With reference to FIG. 7G, at process 706, electrically conductive contact material (e.g., a metal) is deposited in the contact trench 746 of FIG. 7F, to form a main body 114A of the electrical conductor 114 (e.g., metallic electrode) in a DUC 700G. In implementations, the electrically conductive contact material is deposited over the memristive material 113 to spatially overlap areas of terminated conductive nano-fibers intersecting the memristive material 113.

FIG. 7H depicts a system 700H including DUCs 700G after a process 707 of depositing a top layer of a second insulating layer 114B. In the example of FIG. 7H, four memristor layers 113 (represented at 750-753) and four main bodies 114A of electrical conductors 114 (represented at 756-759) have been formed. Layers 104, 116A and 114B are shown slightly offset for illustrative purposes only. Established lithographic techniques may be utilized to deposit the second insulating layer 114B.

FIG. 7I, depicts the system 700I, comprising the system 700H after a process 708 of etching of the second insulating layer 114B and depositing one or more layers of electrically conductive material indicated at 762. Layers 104, 116A, 114B and 762 are shown slightly offset for illustrative purposes only. Established lithographic techniques may be utilized to perform the process 708.

FIG. 7J depicts process 709, wherein a contact pad 114B of the electrical conductor 114, made of the electrically conductive material 762 of FIG. 7I, is formed by patterning/etching techniques onto the second insulating layer 116B, resulting in the DUC 700J. The electrically conductive material 762 may be the same or different from the material of main body 114A.

FIG. 7K depicts a system 700K, comprising the system 700I after a process 710 of forming the contact pads 114B over each of the plurality of main bodies 114A, thereby forming the electrical conductors 114 (depicted in FIG. 1). Layers 104, 116A, and 114B are shown slightly offset for illustrative purposes only. Established lithographic techniques may be utilized to perform the process 710.

Turning to FIG. 7L, at process 711, the modulating device 120 (e.g., a spiking neuron device) is formed or deposited over at least a portion of the contact pad 114B of the electrical conductor 114, thereby forming DUC 700L. In implementations, the modulating device 120 is fabricated or transfer printed onto the contact pad 114B, such that the modulating device 120 is in electrical communication with the electrical conductor 114.

With reference to FIG. 7M, at process 712, an electrode trench 764 is formed through the first and second insulating layers 116A and 116B of the DUC 700L, and at least part way through the mesh layer 104 (offset from the isolation trench 730 and memristor trench 740), thereby forming DUC 700M. In embodiments, the electrode trench 764 is patterned and etched on an opposite side of the isolation trench 739 from the memristor device 112, leaving ends of conductive nano-strands 108 exposed and mostly intact along walls of the electrode trench 764.

Turning to FIG. 7N, at process 713, the electrode 118 is formed within the electrode trench 764 of DUC 700M and extends to contact at least a portion of the modulating device 120, such that the electrode 118 is in electrical communication with the modulating device 120, thus forming DUC 700N. In implementations, forming the electrode 118 comprises depositing, patterning, and etching electrically conductive material to form the electrode 118. In aspects of the invention, conductive material is deposited and patterned such that it overlaps exposed ends of the conductive nano-strands 108, enabling electrical signal communication between the conductive nano-strands 108 and the electrode 118 at distinct contact points or nodes.

FIG. 7O depicts a final neural network system 700O after modulation devices 120 and electrodes (118, 118') have been formed for each of the neural network devices 100A, 100A', 100A", and 100A''' of the system in accordance with processes 712 and 713 of FIGS. 7M and 7N. In the example of FIG. 7O, each of the modulation devices 120 are in the form of a spiking neuron device in Ohmic series contact with an electrode 118.

In implementations, an output contact trench is etched into the neural network system 700E offset from electrode trenches in which the electrodes 118 are formed, and electrically conductive material is deposited in the output contact trench, patterned and etched to create an output contact electrode 118'. In one example, electrical signals applied to one or more conductive nano-strands 108 are promulgated in a non-determinative manner through the one or more conductive nano-strands 108 to a first neural network device 100A, from the first neural network device 100A to a second neural network device 100A', and from the second neural network device 100A' to the output neural network device 100A", for communication to a remote device 124 via a wire 122. Layers 104, 116A, and 114B are shown slightly offset for illustrative purposes only.

Based on the above, it can be understood that lithographic patterning steps utilized in embodiments of the invention define neuron nodes and global interconnections, as well as their interfaces (dendritic connections) with massive numbers (e.g., >100) of conductive nano-strands. Lithographic patterning steps are not required to define each dendritic connection individually, enabling devices and systems to be manufactured with relatively few steps in accordance with embodiments of the invention. A variety of lithographic techniques may be utilized to implement embodiments of the invention, and the invention is not intended to be limited to particular techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a neural network device comprising:
   forming a mesh layer on a substrate, the mesh layer including a matrix of randomly dispersed conductive nano-strands insulated from one another;
   forming an isolation trench extending into the mesh layer;
   forming a memristor device extending into the mesh layer, the memristor device including: an electrical conductor, and a layer of memristive material in electrical contact with individual nano-strands of a first set of the conductive nano-strands in the mesh layer;
   forming an electrode extending into the mesh layer and spaced from the memristor device by the isolation trench, wherein the electrode is in electrical contact with individual conductive nano-strands of a second set of the conductive nano-strands in the mesh layer; and
   forming a modulating device bridging the memristor device and the electrode.

2. The method of claim 1, wherein the memristive material comprises a metal oxide film, and conductive nano-strands within the matrix of randomly dispersed conductive nano-strands are each sheathed in an insulated material or embedded in the insulating material.

3. The method of claim 1, wherein forming the mesh layer on the substrate includes spin coating the conductive nano-strands on the substrate.

4. The method of claim 1, further comprising forming a via in the mesh layer, wherein the via is configured to supply an electrical current to a plurality of individual conductive nano-strands within the mesh layer.

5. The method of claim 1, further comprising forming an electrical connection from the electrode to a remote device.

6. The method of claim 1, wherein the memristor device is configured to send electrical signals received from the individual nano-strands of the first set of conductive nano-strands to the modulating device via the electrical conductor, and the modulating device is configured to automatically send an output signal to the electrode when stored potential at the modulating device due to the electrical signals exceeds a predetermined threshold value.

7. A neural network device comprising:
   a mesh layer including a matrix of randomly dispersed conductive nano-strands within an insulating material;
   a memristor device extending through at least part of the mesh layer, the memristor device including: a layer of memristive material in contact with a set of the conductive nano-strands in the mesh layer, and an electrical conductor;
   an electrode extending through at least part of the mesh layer and spaced from the memristor device; and
   a modulating device bridging the memristor device and the electrode.

8. The neural network device of claim 7, further comprising an isolation trench extending through at least part of the mesh layer between the memristor device and the electrode.

9. The neural network device of claim 7, wherein the electrode is in electrical communication with a remote device and/or an electrical source.

10. The neural network device of claim 7, wherein the conductive nano-strands are selected from the group consisting of: nanowires and carbon nanotubes.

11. The neural network device of claim 7, wherein the modulating device is in electrical communication with a remote device.

12. The neural network device of claim 7, wherein the set of conductive nano-strands comprises more than one hundred (100) conductive nano-strands.

13. The neural network device of claim 7, further comprising an electrical input in communication with the set of conductive nano-strands.

14. The neural network device of claim 7, wherein the memristor device is configured to send electrical signals received from the individual nano-strands of the set of conductive nano-strands to the modulating device via the electrical conductor, and the modulating device is configured to automatically send an output signal to the electrode when stored potential at the modulating device due to the electrical signals exceeds a predetermined threshold value.

15. A system comprising:

a plurality of spaced-apart neural network devices sharing a mesh layer including a matrix of randomly dispersed conductive nano-strands in an insulating substrate, wherein each of the neural network devices includes:

a memristor device extending through at least part of the mesh layer, the memristor device including: a layer of memristive material in contact with the conductive nano-strands in the mesh layer, and an electrical conductor;

an electrode extending through at least part of the mesh layer and spaced from the memristor device;

a modulating device bridging the memristor device and the electrode; and an electrical input in communication with a set of the conductive nano-strands in the mesh layer.

16. The system of claim 15, wherein each of the plurality of the spaced-apart neural network devices further comprise an isolation trench extending through at least part of the mesh layer between the memristor device and the electrode.

17. The system of claim 15, wherein an electrode of at least one of the spaced-apart neural network devices is in electrical communication with a remote device and/or an electrical source.

18. The system of claim 15, wherein the conductive nano-strands are selected from the group consisting of: nanowires and carbon nanotubes.

19. The system of claim 15, wherein at least one of the modulating devices is in electrical communication with a remote device.

20. The system of claim 15, wherein the set of conductive nano-strands comprises more than one hundred (100) conductive nano-strands.

* * * * *